US006970487B2

(12) United States Patent
Shibuya

(10) Patent No.: US 6,970,487 B2
(45) Date of Patent: Nov. 29, 2005

(54) SEMICONDUCTOR LASER DRIVING CIRCUIT AND OPTICAL HEAD

(75) Inventor: Giichi Shibuya, Tokyo (JP)

(73) Assignee: TDK Corporation, Tokyo (JP)

( * ) Notice: Subject to any disclaimer, the term of this patent is extended or adjusted under 35 U.S.C. 154(b) by 298 days.

(21) Appl. No.: 10/405,625

(22) Filed: Apr. 3, 2003

(65) Prior Publication Data

US 2004/0091007 A1    May 13, 2004

(30) Foreign Application Priority Data

Apr. 18, 2002    (JP) ............................. 2002-115726

(51) Int. Cl.[7] .............................. H01S 3/00; H01S 5/00
(52) U.S. Cl. ............... 372/38.02; 372/38.1; 372/38.03; 372/38.07; 372/50.1
(58) Field of Search ........................ 372/38.02, 38.1, 372/38.03, 38.07, 43, 50

(56) References Cited

U.S. PATENT DOCUMENTS

2004/0032888 A1 *   2/2004   Ferstl ...................... 372/38.02

FOREIGN PATENT DOCUMENTS

JP           A 5-315686       11/1993

* cited by examiner

*Primary Examiner*—Minsun Oh Harvey
*Assistant Examiner*—Armando Rodriguez
(74) *Attorney, Agent, or Firm*—Oliff & Berridge, PLC

(57) ABSTRACT

A semiconductor laser driving circuit comprises a driving IC and a substrate on which the IC is mounted. The IC incorporates: a switching element for generating a driving signal; a high-potential power terminal and a low-potential power terminal for feeding supply voltage to the switching element; and a driving signal output terminal for outputting the driving signal generated at the switching element to an external device. These three terminals are disposed side by side at one of sides of a main body of the IC. The substrate incorporates three conductors to be connected to the three terminals. Two chip capacitors are disposed beside the one of the sides of the IC at which the three terminals are disposed. An end of each of the capacitors is connected to the high-potential power terminal while the other end is connected to the low-potential power terminal.

10 Claims, 9 Drawing Sheets

SEMICONDUCTOR LASER DRIVING CIRCUIT AND OPTICAL HEAD

BACKGROUND OF THE INVENTION

1. Field of the Invention

The present invention relates to a semiconductor laser driving circuit for driving a semiconductor laser utilized in optical recording and to an optical head incorporating a semiconductor laser and a driving circuit thereof.

2. Description of the Related Art

The amount of information handled under a variety of circumstances has been dramatically increasing. It is thus desired to increase the storage capacity and the data transfer speed of the recording system that performs writing and reading of such information. It is especially an important technical issue to make the writing speed of the large-capacity optical recording system using an optical storage medium such as an optical disk as high as that of magnetic disk drives. Developments have been thus increasingly made in optical storage media adaptable to the high writing speed.

In general the optical recording system incorporates an optical head disposed to face an optical storage medium. The optical head applies light to the medium and data is thereby optically recorded on the medium. A semiconductor laser is generally used as a light source of the optical head. The semiconductor laser is driven by a semiconductor laser driving circuit so that the laser emits pulsed light when data is written. The driving circuit incorporates a switching element that generates a driving signal having rectangular waves that controls the timing of emission of the laser. The driving signal is then given to the laser.

To make the writing speed of the optical recording system higher, it is required to make the output of the semiconductor laser greater and to make the pulse width of the light emitted from the laser smaller. To reduce the pulse width it is important to make the transmission line through which the driving signal is sent as short as possible so that degradation in the waveform of the driving signal on the line is prevented. The driving circuit therefore incorporates an integrated circuit (also referred to as IC in the following description) dedicated to driving the semiconductor laser, and the driving circuit is mounted on the optical head in many cases.

In the operation of the above-mentioned IC for driving the semiconductor laser, ripple components are superposed on the supply voltage of the driving IC as the switching element is operated. The ripple components superposed on the supply voltage generate unfavorable ripple components, too, on the driving signals. In general, a capacitor having a large capacity is therefore connected between the ground line and the power line connected to the IC for driving, so that the ripple components superposed on the supply voltage of the IC are reduced. In prior art the location in which this capacitor is disposed is not particularly considered.

A conventional driving circuit so far has the ability to generate a driving signal for having the semiconductor laser emit pulsed light having a desired pulse width. For example, the minimum pulse width of pulsed light is approximately 29 ns when data is written on a compact disk rewritable (CD-RW) at a quadruple speed. The conventional driving circuit is capable of generating a driving signal for having the semiconductor laser emit pulsed light having a width of this order without any particular problem.

To make the width of pulsed light shorter, however, it is necessary that the driving circuit generate a driving signal having rectangular waves of shorter width, for further increasing writing speed.

The rise time of a wave of a driving signal typically used, such as a rectangular wave signal generated by a transistor-transistor logic (TTL), is of the order of 1 ns. For an actual electronic circuit, however, there exist impedance mismatches at the input and output, and a floating impedance on the transmission lines. As a result, rounding is produced at the rise of a wave of the driving signal. This rounding causes distortion of waves of pulsed light emitted from the semiconductor laser.

Such distortion of waves of pulsed light will not cause problems of the operation of the optical recording system if the pulse width of pulsed light is sufficiently great. If the pulse width is reduced, however, the proportion of distorted portions of the waves of the entire pulsed light is made greater. As thus described, when data is written on an optical storage medium through the use of pulsed light having a great proportion of distorted portions of the waves, it is possible that energy having a sufficient power will not be supplied to the medium. As a result, data will not be correctly written on the medium and the possibility of occurrence of reading error will be increased.

As thus described, the conventional semiconductor laser driving circuit has the problem that it is not capable of generating a good driving signal, particularly when the pulse width of pulsed light emitted from the semiconductor laser is reduced.

OBJECT AND SUMMARY OF THE INVENTION

It is an object of the invention to provide a semiconductor laser driving circuit and an optical head that are capable of generating a good driving signal, even when the pulse width of pulsed light emitted from the semiconductor laser is small.

A semiconductor laser driving circuit of the invention comprises: an integrated circuit for driving a semiconductor laser that emits light used for optical recording; and a substrate on which the integrated circuit is mounted. The integrated circuit incorporates: a switching element generating a driving signal for driving the semiconductor laser; a high-potential power terminal and a low-potential power terminal for feeding supply voltage to the switching element; and a driving signal output terminal for outputting the driving signal generated at the switching element to an external device. The high-potential power terminal, the low-potential power terminal and the driving signal output terminal are disposed side by side at one of sides of the integrated circuit. The substrate incorporates: a high-potential conductor that is connected to the high-potential power terminal and applies a high potential to the high-potential power terminal; a low-potential conductor that is connected to the low-potential power terminal and applies a low potential to the low-potential power terminal; and a driving signal transmitting conductor that connects the driving signal output terminal to the semiconductor laser and transmits the driving signal to the semiconductor laser. The semiconductor laser driving circuit further comprises a capacitor that is disposed beside the one of the sides of the integrated circuit, one of ends of the capacitor being connected to the high-potential power terminal and the other end being connected to the low-potential power terminal.

An optical head of the invention comprises: a semiconductor laser that emits light used for optical recording; an optical system for applying the light emitted from the semiconductor laser to an optical storage medium; and the above-mentioned semiconductor laser driving circuit for driving the semiconductor laser.

According to the semiconductor laser driving circuit or the optical head of the invention, the high-potential power terminal, the low-potential power terminal and the driving signal output terminal of the integrated circuit for driving the semiconductor laser are disposed side by side at the one of the sides of the integrated circuit. The capacitor is disposed beside the one of the sides of the integrated circuit. One of the ends of the capacitor is connected to the high-potential power terminal and the other end is connected to the low-potential power terminal. Such a configuration allows the capacitor to be located near the switching element in the integrated circuit. The capacitor removes the ripple components superposed on the supply voltage.

According to the semiconductor laser driving circuit or the optical head of the invention, the driving signal output terminal may be placed between the high-potential power terminal and the low-potential power terminal, and the capacitor may be disposed to span the driving signal transmitting conductor.

According to the semiconductor laser driving circuit or the optical head of the invention, one of the ends of the capacitor may be connected to the high-potential conductor and connected to the high-potential power terminal via the high-potential conductor, and the other end of the capacitor may be connected to the low-potential conductor and connected to the low-potential power terminal via the low-potential conductor.

According to the semiconductor laser driving circuit or the optical head of the invention, the capacitor may be placed on the high-potential power terminal and the low-potential power terminal.

According to the semiconductor laser driving circuit or the optical head of the invention, the number of the capacitor may be more than one and the capacitors may be connected in parallel to each other.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

[First Embodiment]

Figure 1:
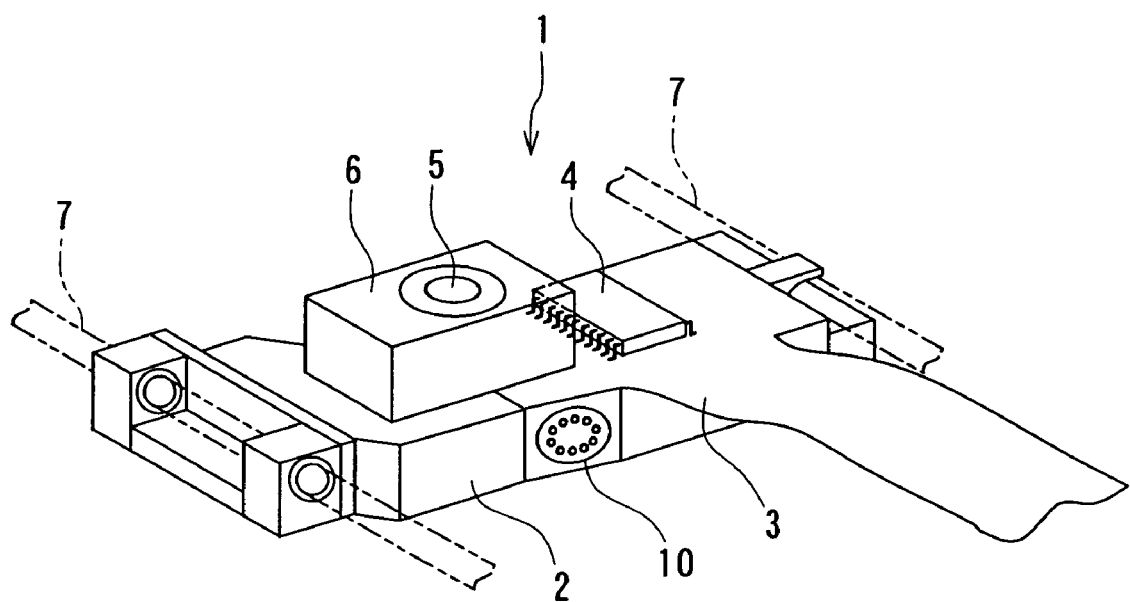
FIG. 1 is a perspective view of an optical head of a first embodiment of the invention.

Referring to FIG. 1, the outline of the configuration of an optical head of a first embodiment of the invention will now be described. FIG. 1 is a perspective view of the optical head of the first embodiment. The optical head is used in an optical read and write apparatus described later. The optical read and write apparatus optically writes information on an optical disk that is a circular-plate-shaped optical storage medium, and optically reads information from the optical disk. The optical disk has a data storage layer in which information is written. In addition, the optical disk has a plurality of tracks.

As shown in FIG. 1, the optical head 1 of this embodiment comprises: an optical head main unit 2 in which a part of an optical system of the optical head described later is incorporated; a first laser unit 10 attached to the head main unit 2; a flexible circuit board 3 connected to the head main unit 2; and a semiconductor driving IC 4 mounted on the circuit board 3. The first laser unit 10 is connected to the circuit board 3. The circuit board 3 and the laser driving IC 4 form the semiconductor laser driving circuit of this embodiment.

The optical system of the optical head includes an objective lens 5. Although not shown in FIG. 1, the optical head 1 further comprises an actuator capable of having the objective lens 5 move along the direction orthogonal to the optical disk surface and the direction across the tracks. The actuator is fastened to the head main unit 2. The optical head 1 further comprises an actuator cover 6 that surrounds the actuator.

The first laser unit 10 includes a first semiconductor laser and a first photo detector described later. The laser driving IC 4 is designed to drive the first semiconductor laser. Although not shown in FIG. 1, the optical head 1 further comprises a second laser unit incorporated in the optical head main unit 2, and a high-frequency superposing circuit connected to the second laser unit. The second laser unit includes a second semiconductor laser and a second photo detector. The main unit 2 is held by two rails 7 disposed in a parallel manner, the main unit 2 being movable across the tracks of an optical disk.

Figure 2:
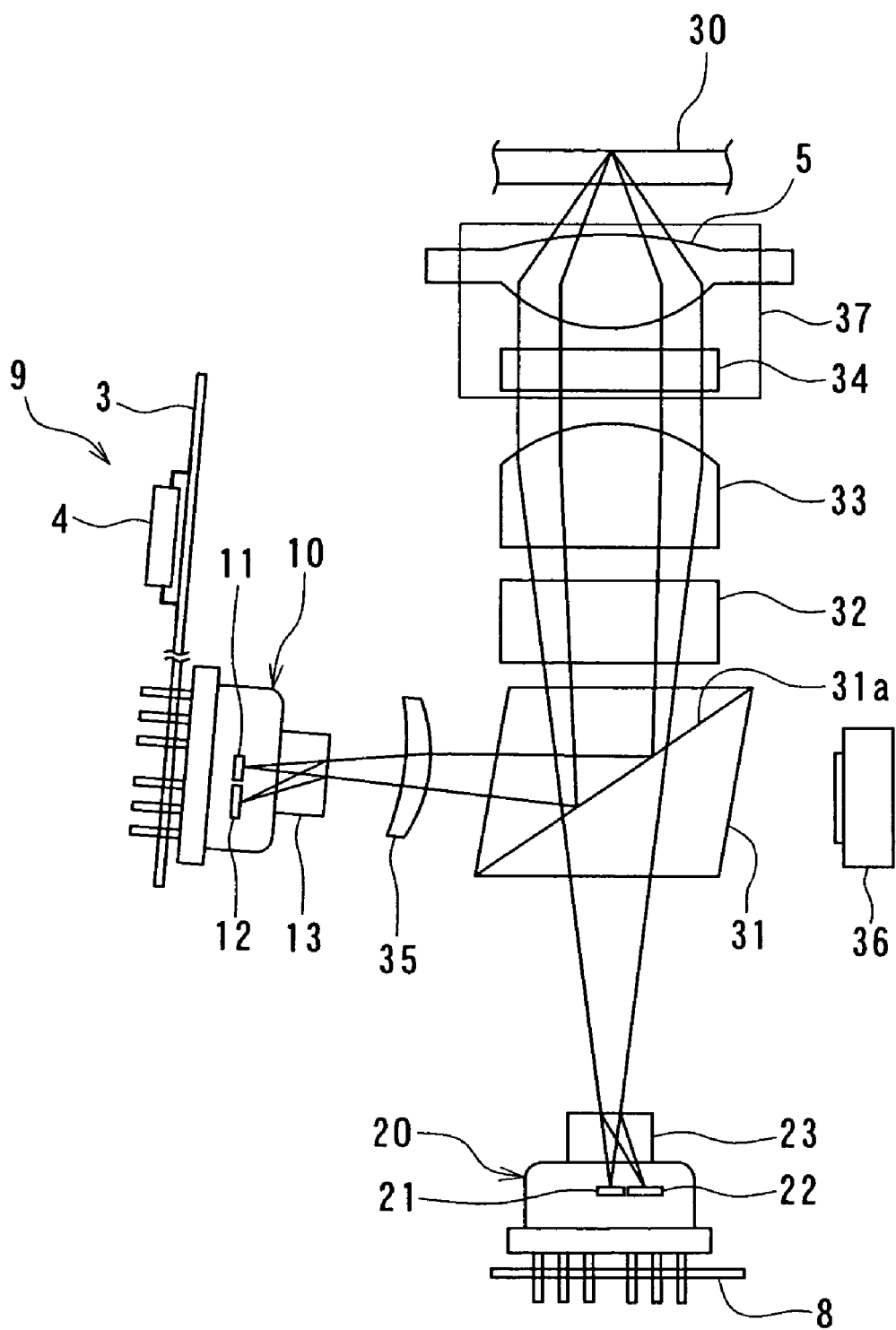
FIG. 2 illustrates an optical system of the optical head of the first embodiment.

FIG. 2 illustrates the optical system of the optical head 1. The optical head 1 is disposed to face an optical disk 30. As described above, the optical head 1 comprises: the first laser unit 10; the flexible circuit board 3 coupled to the first laser unit 10; the semiconductor laser driving IC 4 mounted on the flexible circuit board 3; the second laser unit 20; and the substrate 8 coupled to the second laser unit 20. The high frequency superposing circuit described later is mounted on the substrate 8.

The first laser unit 10 incorporates: a first semiconductor laser 11 that emits laser light having a first wavelength; a first photo detector 12; and a first hologram 13. The first photo detector 12 has a photoreceptor that is split in four parts, for example, so as to generate a read signal, a focus error signal and a tracking error signal. The first hologram 13 allows the light emitted from the first semiconductor laser 11 to pass through the hologram 13, and diffracts part of return light from the optical disk 30 and introduces it to the first photo detector 12.

The second laser unit 20 incorporates: a second semiconductor laser 21 that emits laser light having a second wavelength different from the first wavelength; a second photo detector 22; and a second hologram 23. The second photo detector 22 has a photoreceptor that is split in four parts, for example, so as to generate a read signal, a focus error signal and a tracking error signal. The second hologram 23 allows the light emitted from the second semiconductor laser 21 to pass through the hologram 23, and diffracts part of return light from the optical disk 30 and introduces it to the second photo detector 22.

The optical system of the optical head comprises the objective lens 5 that is disposed to face the optical disk 30. The optical system further comprises a dichroic prism 31, a turning mirror 32, a collimating lens 33, and a quarter-wave plate 34 that are disposed in this order between the second laser unit 20 and the objective lens 5, the dichroic prism 31 being closest to the second laser unit 20. The dichroic prism 31 has a dichroic mirror 31*a*. The first laser unit 10 is disposed at a point at which part of return light from the optical disk 30 that is reflected off the dichroic mirror 31*a* enters. The optical system further comprises: a corrector plate 35 placed between the first laser unit 10 and the dichroic prism 31; and a photo detector 36 for a front monitor, the photo detector 36 being opposed to the corrector plate 35 with the dichroic prism 31 in between.

The optical head comprises an actuator 37 that allows the objective lens 5 and the quarter-wave plate 34 in combination to move across the tracks of the optical disk 30 and to move in the direction orthogonal to the surface of the disk 30.

The operation of the optical system of the optical head shown in FIG. 2 will now be described. The optical head 1 of this embodiment is designed to be used in an optical read and write apparatus capable of handling two types of optical disks 30 such as a combination of a compact disk (CD) and a digital video disk or digital versatile disk (DVD). The first laser unit 10 is used to write information on the first-type optical disk 30 and to read information from the first-type optical disk 30. The second laser unit 20 is used to write information on the second-type optical disk 30 and to read information from the second-type optical disk 30.

To write information on the first-type optical disk 30, the first semiconductor laser 11 of the first laser unit 10 is driven by the semiconductor laser driving IC 4 so that the first semiconductor laser 11 intermittently emits high-power pulsed light for writing. The light emitted from the first semiconductor laser 11 passes through the hologram 13 and the corrector plate 35 and then enters the dichroic prism 31. A major part of the light is reflected off the dichroic mirror 31*a* and the other part passes through the dichroic mirror 31*a* and enters the photo detector 36 for the front monitor. An output signal of the photo detector 36 is used to perform automatic light control of the light emitted from the semiconductor laser 11. The light reflected off the dichroic mirror 31*a* passes through the turning mirror 32, the collimating lens 33, the quarter-wave plate 34 and the objective lens 5 in this order. The light is thus converged and applied to the optical disk 30. Information is optically written in the data storage layer of the optical disk 30 through the use of the light. Part of the light applied to the optical disk 30 is reflected off the data storage layer to be return light and emitted from the optical disk 30. This return light passes through the objective lens 5, the quarter-wave plate 34, the collimating lens 33 and the turning mirror 32 in this order, and then enters the dichroic prism 31. A major part of the return light is reflected off the dichroic mirror 31*a*. The return light reflected off he dichroic mirror 31*a* passes through the corrector plate 35 and is then diffracted by the first hologram 13 and introduced to the first photo detector 12. A focus error signal and a tracking error signal are generated, based on the output of the photo detector 12.

To read information from the first-type optical disk 30, the first semiconductor laser 11 of the first laser unit 10 is driven by the semiconductor laser driving IC 4 so that the first semiconductor laser 11 continuously emits low-power light for reading. The light emitted from the first semiconductor laser 11 passes through the path the same as that of the case in which information is written, and is then applied to the optical disk 30. Part of the light applied to the optical disk 30 is reflected off the data storage layer to be return light having data, and emitted from the optical disk 30. This return light passes through the path the same as that of the case in which information is written, and enters the first photo detector 12. A read signal, a focus error signal and a tracking error signal are generated, based on the output of the photo detector 12.

To write information on the second-type optical disk 30, the second semiconductor laser 21 of the second laser unit 20 is driven by a write signal given from a source outside the optical head 1, so that the second semiconductor laser 21 intermittently emits high-power pulsed light for writing. The light emitted from the second semiconductor laser 21 passes through the hologram 23 and then enters the dichroic prism 31. A major part of the light passes through the dichroic mirror 31*a* while the other part is reflected off the dichroic mirror 31*a* and enters the photo detector 36 for the front monitor. An output signal of the photo detector 36 is used to perform automatic light control of the light emitted from the semiconductor laser 21. The light that has passed through the dichroic mirror 31*a* passes through the turning mirror 32, the collimating lens 33, the quarter-wave plate 34 and the objective lens 5 in this order. The light is thus converged and applied to the optical disk 30. Information is optically written in the data storage layer of the optical disk 30 through the use of the light. Part of the light applied to the optical disk 30 is reflected off the data storage layer to be return light and emitted from the optical disk 30. This return light passes through the objective lens 5, the quarter-wave plate 34, the collimating lens 33 and the turning mirror 32 in this order, and then enters the dichroic prism 31. A major part of the return light passes through the dichroic mirror 31*a*. The return light that has passed through the dichroic mirror 31*a* is diffracted by the second hologram 23 and introduced to the second photo detector 22. A focus error signal and a tracking error signal are generated, based on the output of the photo detector 22.

To read information from the second-type optical disk 30, a high-frequency signal generated at the high-frequency superposing circuit is superposed on an electric current of a specific level given from a source outside the optical head 1, so that a driving current is generated. The second semiconductor laser 21 is driven by the driving current. The light emitted from the second semiconductor laser 21 passes through the path the same as that of the case in which information is written, and is then applied to the optical disk 30. Part of the light applied to the optical disk 30 is reflected off the data storage layer to be return light having data, and emitted from the optical disk 30. This return light passes through the path the same as that of the case in which information is written, and enters the second photo detector 22. A read signal, a focus error signal and a tracking error signal are generated, based on the output of the photo detector 22.

Figure 3:
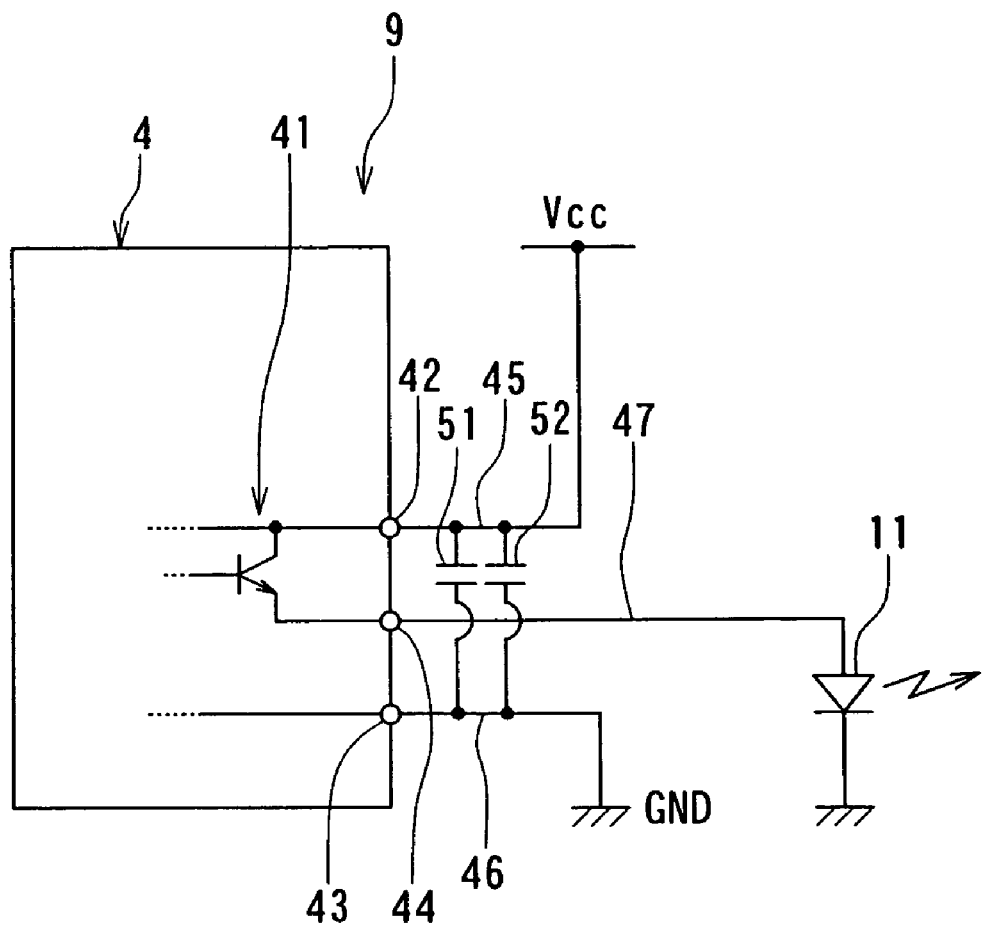
FIG. 3 is a schematic diagram of a semiconductor laser driving circuit of the first embodiment.
Figure 4:
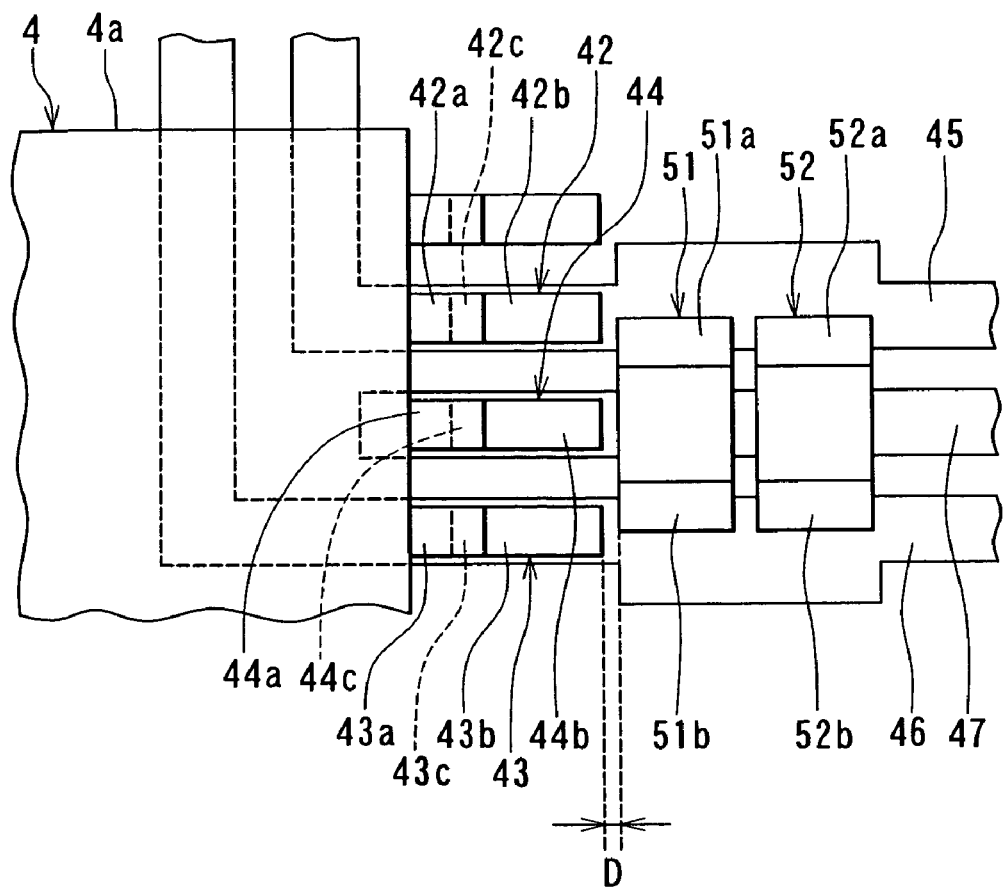
FIG. 4 is a plan view of a part of a semiconductor laser driving IC of the first embodiment and the neighborhood thereof.
Figure 5:
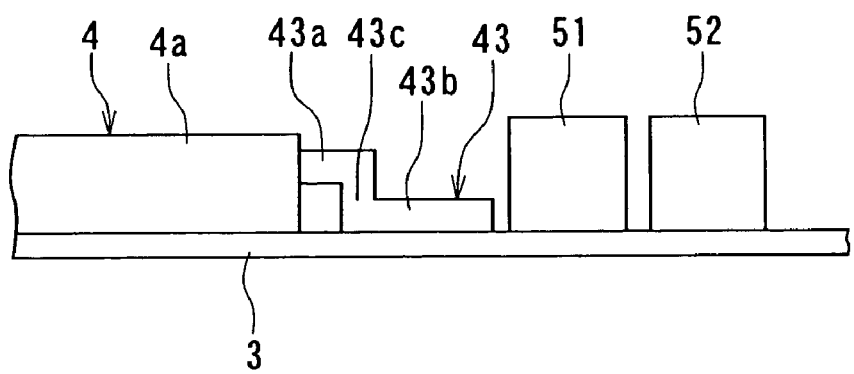
FIG. 5 is a side view of the part of the semiconductor laser driving IC of the first embodiment and the neighborhood thereof.

Reference is now made to FIG. 3 to FIG. 5 to describe the detailed configuration of the semiconductor laser driving circuit of the embodiment. FIG. 3 is a schematic diagram of the semiconductor laser driving circuit. FIG. 4 is a plan view of a part of the semiconductor laser driving IC 4 and the neighborhood thereof. FIG. 5 is a side view of the part of the semiconductor laser driving IC 4 and the neighborhood thereof. FIG. 5 illustrates the semiconductor laser driving IC of FIG. 4 seen from the bottom.

The semiconductor laser driving circuit 9 of the embodiment comprises: the semiconductor laser driving IC 4 for driving the first semiconductor laser 11; and the flexible circuit board 3 on which the IC 4 is mounted. The IC 4 comprises a main body 4a and a switching element 41 that is provided in the main body 4a and generates a driving signal for driving the semiconductor laser 11. The IC 4 further incorporates: a high-potential power terminal 42 and a low-potential power terminal 43 for feeding supply voltage to the switching element 41; and a driving signal output terminal 44 for outputting a driving signal generated by the switching element 41 to an external device. The terminals 42 to 44 are formed to project outwards from a side of the main body 4a of the IC 4. The terminals 42 to 44 have: main body connecting portions 42a, 43a and 44a that extend from one of the sides of the main body 4a toward outside in the horizontal direction; board connecting portions 42b, 43b and 44b that are connected to the flexible circuit board 3; and couplers 42c, 43c and 44c that couple the main body connecting portion 42a, 43a and 44a to the board connecting portions 42b, 43b and 44b, respectively.

The switching element 41 may be an NPN bipolar transistor, for example, as shown in FIG. 3. In this example, the collector of the transistor is connected to the high-potential power terminal 42 while the emitter of the transistor is connected to the driving signal output terminal 44. Voltage corresponding to the write signal given from a source outside the optical head 1 is applied to the base of the transistor. The low-potential power terminal 43 is connected to the ground line in the IC 4.

Alternatively, the switching element 41 may be a field-effect transistor. In this example, the drain of the transistor is connected to the high-potential power terminal 42 while the source of the transistor is connected to the driving signal output terminal 44. Voltage corresponding to the write signal given from a source outside the optical head 1 is applied to the gate of the transistor.

As shown in FIG. 4, the high-potential power terminal 42, the low-potential power terminal 43 and the driving signal output terminal 44 are disposed side by side on one of the sides of the IC 4. In this embodiment, in particular, the output terminal 44 is placed between the power terminals 42 and 43.

The flexible circuit board 3 incorporates: a high-potential conductor 45 that is connected to the high-potential power terminal 42 and applies a high potential to the terminal 42; a low-potential conductor 46 that is connected to the low-potential power terminal 43 and applies a low potential to the terminal 43; and a driving signal transmitting conductor 47 that connects the driving signal output terminal 44 to the first semiconductor laser 11, and transmits a driving signal to the laser 11. The conductors 45, 46 and 47 are stripe-shaped.

The semiconductor laser driving circuit of the embodiment comprises two chip capacitors 51 and 52 disposed beside one of the sides of the IC 4 on which the terminals 42, 43 and 44 are placed. An end of each of the capacitors 51 and 52 is connected to the high-potential power terminal 42 while the other end is connected to the low-potential power terminal 43. The capacitors 51 and 52 are provided for reducing ripple components superposed on the supply voltage of the IC 4 incidental to the operation of the switching element 41. The capacitors 51 and 52 have different capacitances. For example, the capacitance of the capacitor 51 is 10 $\mu$F and the capacitance of the capacitor 52 is 0.1 $\mu$F. Although the capacitor 51 is located closer to the terminals 42, 43 and 44 than the capacitor 52 in FIG. 4 and FIG. 5, the location of the capacitors 51 and 52 may be the reverse.

Terminal sections 51a and 51b made of conductors are formed at the ends of the capacitor 51. A portion of the surface of the capacitor 51 between the terminal sections 51a and 51b is made of an insulator. Similarly, terminal sections 52a and 52b made of conductors are formed at the ends of the capacitor 52. A portion of the surface of the chip capacitor 52 between the terminal sections 52a and 52b is made of an insulator.

Both of the capacitors 51 and 52 are disposed to span the driving signal transmitting conductor 47. The terminal sections 51a and 52a are connected to the high-potential conductor 45 while the terminal sections 51b and 52b are connected to the low-potential conductor 46. The connection between the terminal sections 51a and 52a and the high-potential conductor 45, and the connection between the terminal sections 51b and 52b and the low-potential conductor 46 are established by, for example, soldering. The terminal sections 51a and 52a are thereby connected to the high-potential power terminal 42 of the IC 4 via the conductor 45 while the terminal sections 51b and 52b are connected to the low-potential power terminal 43 of the IC 4 via the conductor 46. The capacitors 51 and 52 are disposed in parallel to each other.

As shown in FIG. 4, portions of the high-potential conductor 45 to which the terminal sections 51a and 52a are connected are greater in width than the remaining portions. Similarly, portions of the low-potential conductor 46 to which the terminal sections 51b and 52b are connected are greater in width than the remaining portions.

As shown in FIG. 3, high potential Vcc is applied to the high-potential conductor 45. Low potential (the ground level) GND is applied to the low-potential conductor 46.

As shown in FIG. 4, it is preferred that distance D between the terminals 42, 43 and 44 and the capacitor 51 located near these terminals is 2 mm or smaller.

The operation of the semiconductor laser driving circuit of the embodiment of the invention will now be described. High potential Vcc is supplied to the IC 4 via the high-potential conductor 45 and the high-potential power terminal 42. Low potential GND is supplied to the IC 4 via the low-potential conductor 46 and the low-potential power terminal 43. The potential difference between high potential Vcc and low potential GND is the supply voltage for operating the IC 4. The switching element 41 generates a driving signal for driving the semiconductor laser 11. The driving signal is applied to the semiconductor laser 11 via the driving signal output terminal 44 and the driving signal transmitting conductor 47.

The capacitors 51 and 52 reduce the ripple components superposed on the supply voltage of the IC 4 incidental to the operation of the switching element 41. According to this embodiment, the high-potential power terminal 42, the low potential power terminal 43 and the driving signal output terminal 44 are placed in line at one of the sides of the IC 4. Such placement allows the switching element 41 in the IC 4 to be located near the terminals 42 to 44. In the embodiment the capacitors 51 and 52 are placed beside the above-mentioned one of the sides of the IC 4, and an end of each of the capacitors 51 and 52 is connected to the high-potential power terminal 42 while the other end of each of the capacitors 51 and 52 is connected to the low-potential power terminal 43. This configuration allows the capacitors 51 and 52 to be located near the switching element 41 in the IC 4. Consequently, according to the embodiment, the length of the wiring is reduced between the high-potential conductor 45 and the low-potential conductor 46 that relates to high-frequency signal components (ripple components). It is thereby possible to minimize the delay and lead of the phase between the voltage and the current that result from the inductive and capacitive floating reactance the wiring has. As a result, the capacitors 51 and 52 are capable of reducing the ripple components superposed on the supply voltage to such an extent that rounding would not be produced in the waveform of driving signal. The embodiment of the invention is thus capable of avoiding ripple components superposed on the driving signal and preventing rounding of the waveform of the driving signal. It is thereby possible to produce a driving signal having an ideal waveform even in a high-frequency region.

The above-described features of the embodiment make it possible that the semiconductor laser driving circuit generates a good driving signal even when the pulse width of the pulsed light emitted from the semiconductor laser 11 is small. It is thereby possible to produce pulsed light having an ideal waveform even in a high-frequency region.

If distance D between the capacitor 51 and the terminals 42, 43 and 44 is smaller, it is possible to make the wiring shorter between the high-potential conductor 45 and the low-potential conductor 46 that relates to high-frequency signal components (ripple components). Therefore, smaller distance D is preferred, that is, 2 mm or smaller.

According to the embodiment, the two capacitors 51 and 52 having different capacitances and connected in parallel are provided. The capacitor 51, one of the capacitors that has a greater capacitance, has a greater capability of reducing ripple components than that of the capacitor 52 having a smaller capacitance. On the other hand, the capacitor 52 has a greater capability of suppressing rounding of the waveform of the driving signal than that of the capacitor 51. Therefore, the combination of the two capacitors 51 and 52 makes it possible to reduce the ripple components superposed on the driving signal and to suppress rounding of the waveform of the driving signal more effectively.

According to the embodiment, it is not necessary that the capacitors 51 and 52 are placed side by side in the horizontal direction, but it is possible that they are vertically stacked. According to the embodiment, it is not necessary that the number of the capacitors used for reducing ripples is two, but may be one or three or greater.

Figures 6, 7:
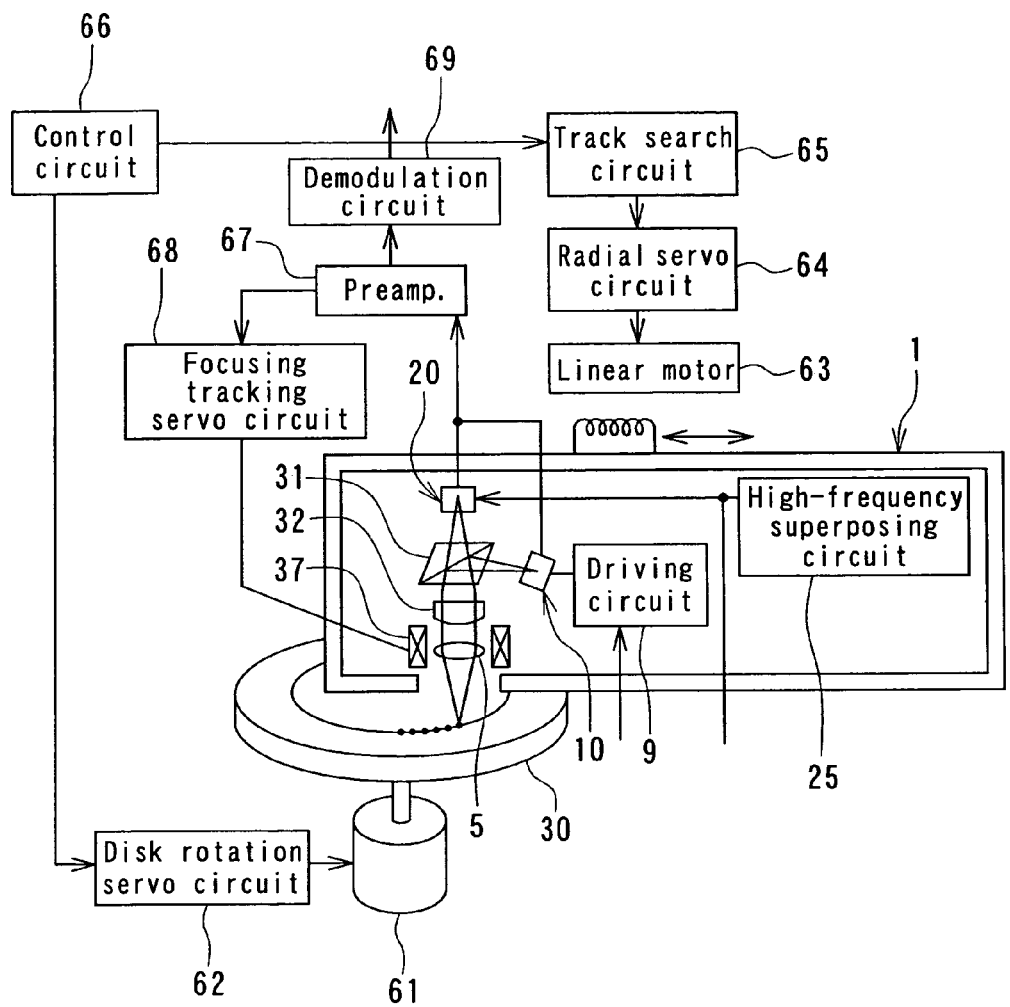
FIG. 6 illustrates an example of configuration of an optical read and write apparatus including the optical head of the first embodiment.
FIG. 7 is a block diagram that illustrates an example of configuration of a read signal processing circuit of the optical read and write apparatus including the optical head of the first embodiment.

An example of the configuration of the optical read and write apparatus including the optical head of the embodiment will now be described. FIG. 6 illustrates an example of the configuration of the main part of the optical read and write apparatus. The optical read and write apparatus of this example comprises: the optical head 1 of the embodiment; a motor 61 for rotating the optical disk 30; and a disk rotation servo circuit 62 for controlling the motor 61 so that the optical disk 30 rotates at a specific speed. In addition to the components shown in FIG. 2, the optical head 1 comprises the high-frequency superposing circuit 25. The high-frequency superposing circuit 25 is connected to the second laser unit 20. The second laser unit 20 is designed to receive a write signal from a source outside the optical head when data is written. When data is read, the second laser unit 20 is designed to receive a driving current that is produced by superposing a high-frequency signal generated at the superposing circuit 25 on a current having a specific level given from a source outside the optical head 1.

The optical read and write apparatus further comprises: a linear motor 63 for moving the optical head 1 across the tracks of the optical disk 30; a radial servo circuit 64 for controlling the linear motor 63; a track search circuit 65 for giving the radial servo circuit 64 a command to shift the point to which the light emitted from the optical head 1 is applied to a desired track; and a control circuit 66 for controlling the disk rotation servo circuit 62 and the track search circuit 65.

The optical read and write apparatus further comprises: a preamplifier 67 for amplifying an output signal of the first photo detector 12 in the first laser unit 10 and an output signal of the second photo detector 22 in the second laser unit 20; and a focusing tracking servo circuit 68 and a demodulation circuit 69 each of which receives an output signal of the preamplifier 67. The focusing tracking servo circuit 68 generates a focus error signal and a tracking error signal based on the output signal of the preamplifier 67, and controls the actuator 37 based on the focus error signal and the tracking error signal so as to perform focusing servo and tracking servo. The demodulation circuit 69 generates a read signal based on the output signal of the preamplifier 67.

FIG. 7 is a block diagram that illustrates an example of configuration of a read signal processing circuit of the optical read and write apparatus. FIG. 7 shows the read signal processing circuit that processes only signals read from one of the two types of optical disks containing information readable by the optical head 1. The read signal processing circuit comprises: a phase equalizer 71 that receives an output signal of the demodulation circuit 69 of FIG. 6 and compensates for phase distortion of this signal; a demodulator 72 that takes a modulating signal out of an output signal of the phase equalizer 71; and an error corrector 73 that performs error correction of an output signal of the demodulator 72.

The read signal processing circuit further comprises: an MPEG2 decoder 74 that converts an output signal of the error corrector 73 to a video data item and an audio data item of the MPEG2 standard; a video D-A converter 75 that performs digital-analog conversion of the video data item outputted from the MPEG2 decoder 74; an NTSC/PAL encoder 76 that generates a composite video signal of the NTSC or PAL system from an output signal of the video D-A converter 75; and a low-pass filter 77 that removes high frequency components from the output signal of the NTSC/PAL encoder 76 and outputs various types of video signals. The low-pass filter 77 outputs, for example, an RGB signal, a luminance signal (Y), a color signal (C), and a composite video signal (CVS).

The read signal processing circuit further comprises: an audio circuit 78 that processes audio data outputted from the MPEG2 decoder 74; and an audio D-A converter 79 that performs digital-analog conversion of the data item outputted from the audio circuit 78 and outputs an audio signal (L or R).

The read signal processing circuit further comprises: a central processing unit (CPU) 80 that controls the error corrector 73, the MPEG2 decoder 74, the audio circuit 78 and so on; a memory 81 connected to the CPU 80; and an input/output interface 82 connected to the CPU 80. The input/output interface 82 controls signal input and output between the CPU 80 and a remote controller, for example.

[Second Embodiment]

Figure 8:
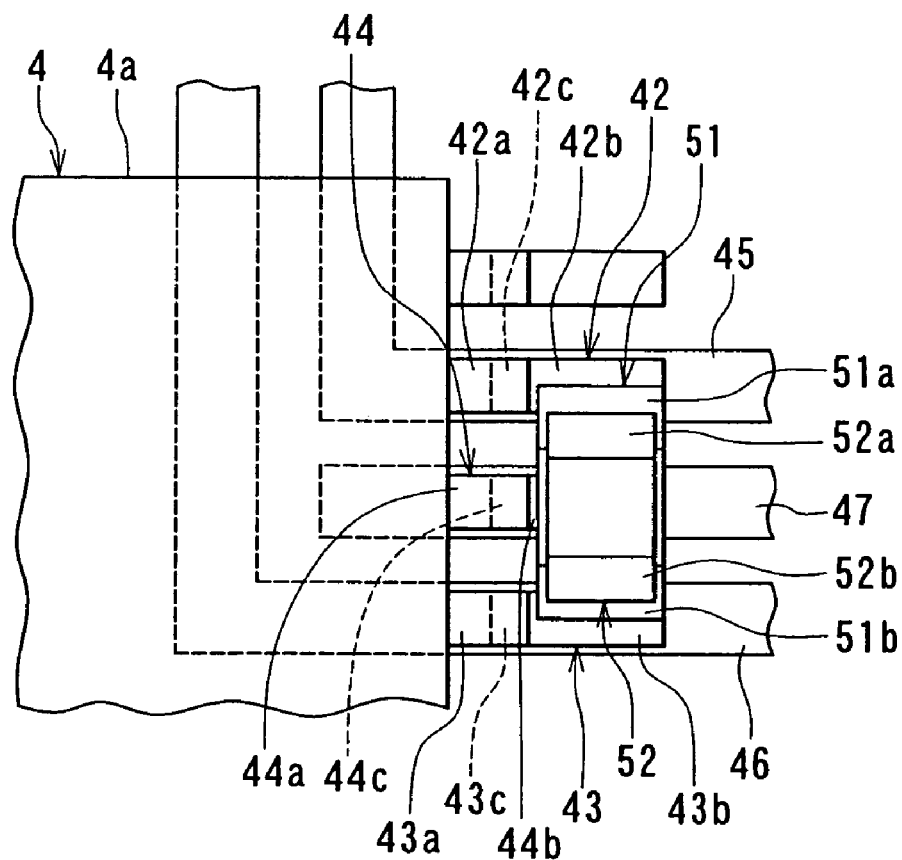
FIG. 8 is a plan view of a part of a semiconductor laser driving IC of a second embodiment of the invention and the neighborhood thereof.
Figure 9:
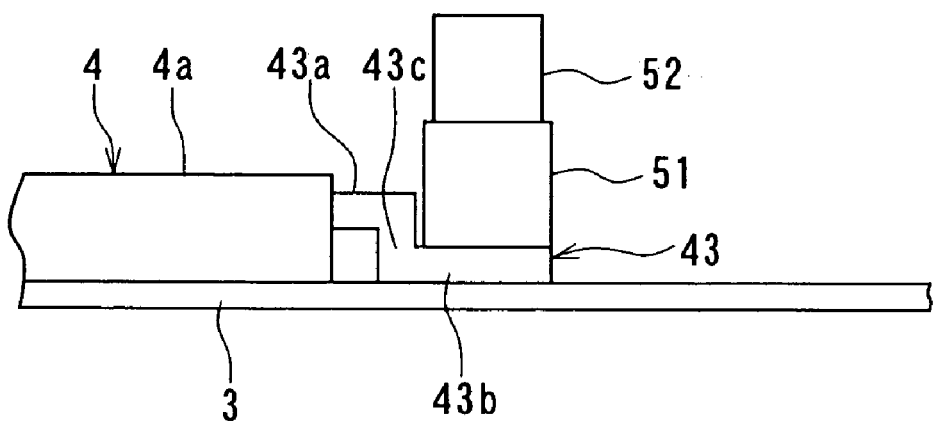
FIG. 9 is a side view of the part of the semiconductor laser driving IC of the second embodiment and the neighborhood thereof.
Figure 10:
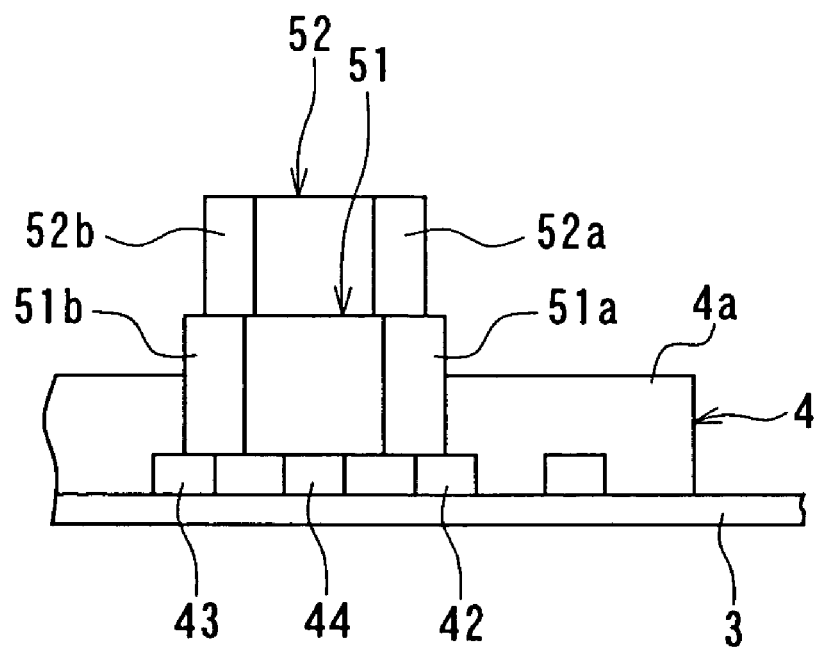
FIG. 10 is another side view of a part of the semiconductor laser driving IC of the second embodiment and the neighborhood thereof.

A semiconductor laser driving circuit and an optical head of a second embodiment of the invention will now be described. FIG. 8 is a plan view of a part of a semiconductor laser driving IC of the second embodiment and the neighborhood thereof. FIG. 9 is a side view of the part of the semiconductor laser driving IC and the neighborhood thereof. FIG. 10 is another side view of the part of the semiconductor laser driving IC and the neighborhood thereof. FIG. 9 illustrates the semiconductor laser driving IC of FIG. 8 seen from the bottom. FIG. 10 illustrates the semiconductor laser driving IC of FIG. 8 seen from the right side.

According to the second embodiment, the capacitors 51 and 52 for removing ripples are disposed on the terminals 42, 43 and 44 of the IC 4 to span the driving signal transmitting conductor 47. To be specific, the capacitor 51 is placed on the board connecting portions 42b, 43b and 44b of the terminals 42, 43 and 44. The terminal sections 51a and 51b are connected to the board connecting portions 42b and 43b by soldering, for example. The capacitor 52 is placed on the capacitor 51. The terminal sections 52a and 52b are connected to the terminal sections 51a and 51b of the capacitor 51 by soldering, for example. As in the first embodiment, the capacitors 51 and 52 are disposed in parallel to each other.

Figure 11:
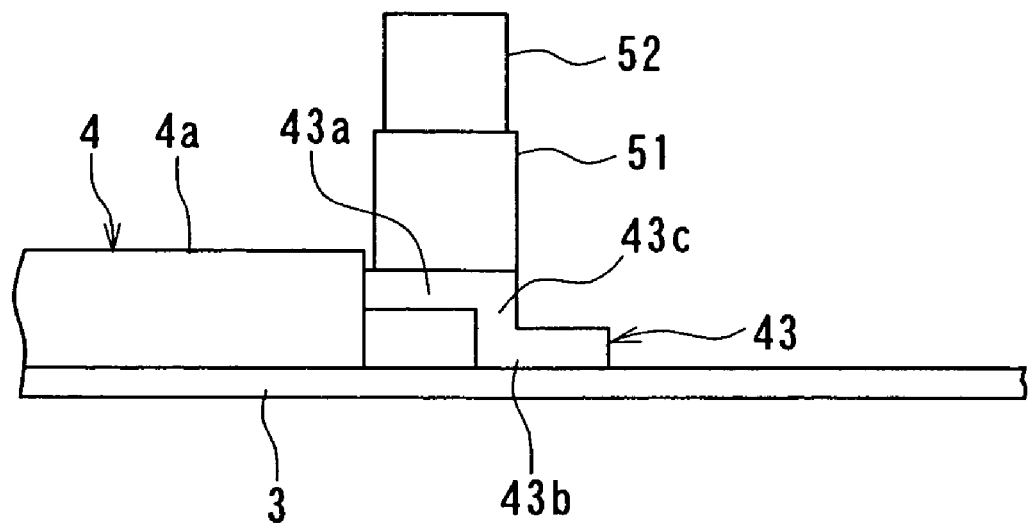
FIG. 11 is a side view of a part of a semiconductor laser driving IC of a modified example of the second embodiment and the neighborhood thereof.

FIG. 11 is a side view of a part of a semiconductor laser driving IC of a modified example of the second embodiment and the neighborhood thereof. In this example the capacitor 51 is placed on the main body connecting portions 42a, 43a and 44a of the terminals 42, 43 and 44. The terminal sections 51a and 51b are connected to the main body connecting portions 42a and 43a, respectively, by soldering, for example. The capacitor 52 is placed on the capacitor 51. The terminal sections 52a and 52b are connected to the terminal sections 51a and 51b of the capacitor 51 by soldering, for example.

The remaining configuration of the second embodiment is similar to that of the first embodiment. The capacitors 51 and 52 of the second embodiment are located closer to the switching element 41 in the IC 4, compared to the first embodiment. As a result, the second embodiment achieves emission of pulsed light having a more ideal waveform.

According to the embodiment, it is not necessary that the capacitors 51 and 52 are vertically stacked, but it is possible that they are placed side by side on the terminals 42, 43 and 44. According to the embodiment, it is not necessary that the number of the capacitors used for reducing ripples is two, but may be one or three or greater.

Figure 12:
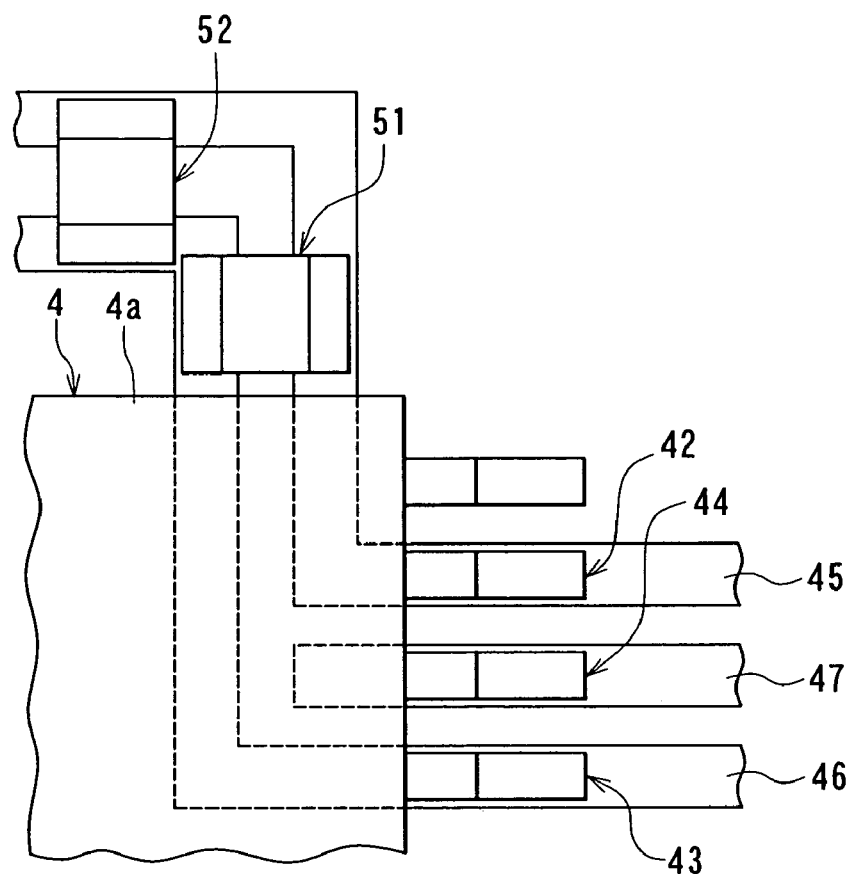
FIG. 12 is a plan view of a part of a reference semiconductor laser driving IC and the neighborhood thereof.

The following is a description of an experiment performed to confirm the effect of the semiconductor laser driving circuit of the second embodiment. In the experiment comparison was made between a reference semiconductor laser driving circuit and the semiconductor laser driving circuits of first and second examples of the embodiment to observe waveforms of driving signals. FIG. 12 is a plan view of a part of the reference semiconductor laser driving IC and the neighborhood thereof. In the reference IC the chip capacitors 51 and 52 are not placed beside one of the sides of the IC 4 where the terminals 42, 43 and 44 are located, but disposed outside another side of the IC 4. In the reference IC the high-potential conductor 45 and the low-potential conductor 46 pass under the IC 4 and extend to points outside the other side of the IC 4. In the reference IC one of the terminal sections of each of the chip capacitors 51 and 52 is connected to the high-potential conductor 45 while the other terminal section is connected to the low-potential conductor 46. In the reference IC the capacitance of the capacitor 51 is 10 $\mu$F. The capacitance of the capacitor 52 is 0.1 $\mu$F.

In the first example of this embodiment of the invention one chip capacitor is disposed on the board connecting portions 42b, 43b and 44b of the terminals 42, 43 and 44. One of the terminal sections of the capacitor is connected to the board connecting portion 42b while the other is connected to the board connecting portion 43b. The capacitance of the capacitor is 0.1 $\mu$F.

In the second example of the embodiment the chip capacitors 51 and 52 are located as shown in FIG. 8. The capacitance of the capacitor 51 is 10 $\mu$F, and the capacitance of the capacitor 52 is 0.1 $\mu$F in the second example.

Figure 13:
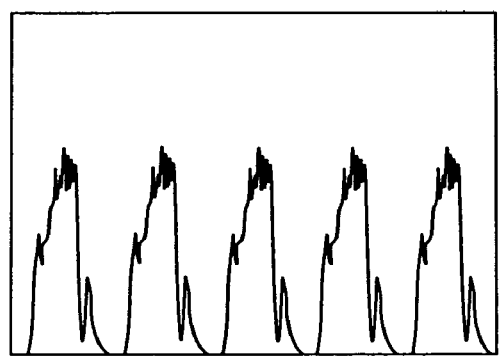
FIG. 13 is a plot showing the waves of a driving signal of a reference semiconductor laser driving circuit.
Figure 14:
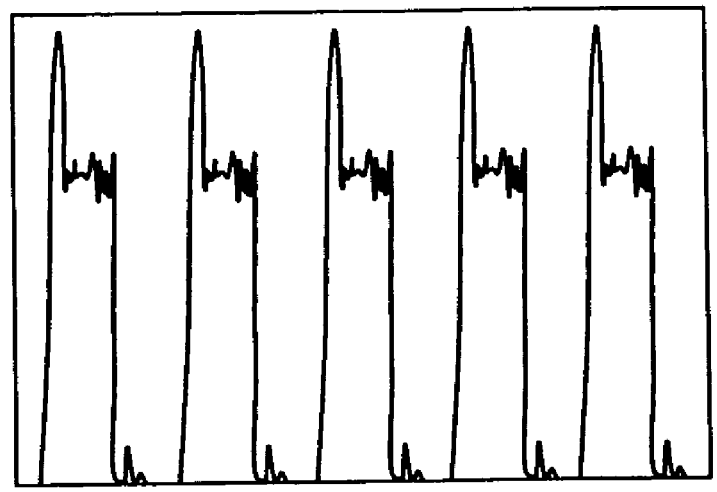
FIG. 14 is a plot showing the waves of a driving signal of the semiconductor laser driving circuit of a first example of the second embodiment.
Figure 15:
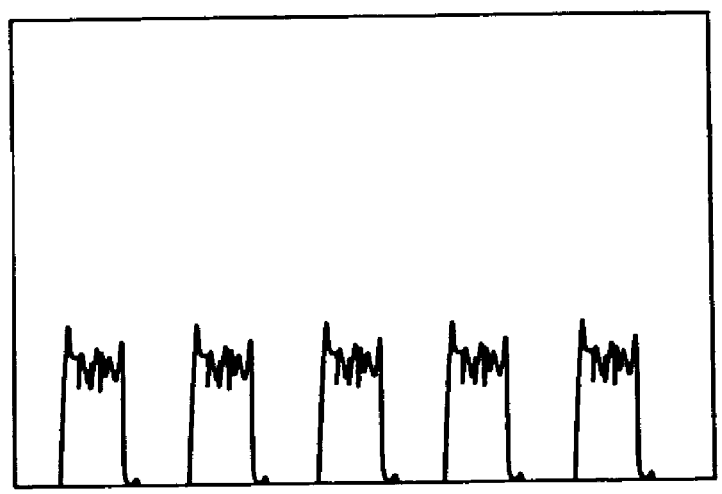
FIG. 15 is a plot showing the waves of a driving signal of the semiconductor laser driving circuit of a second example of the second embodiment.

In the experiment a driving signal having rectangular waves with a frequency of 25 MHz was generated in each of the reference semiconductor laser driving circuit and the semiconductor laser driving circuits of the first and second examples, and the waveform of the driving signal was observed with an oscilloscope. FIG. 13, FIG. 14 and FIG. 15 illustrate the waveforms of the driving signals of the reference semiconductor laser driving circuit, the semiconductor laser driving circuit of the first example, and the semiconductor laser driving circuit of the second example, respectively. FIG. 13, FIG. 14 and FIG. 15 each illustrate the waveform of the driving signal displayed in the oscilloscope.

As shown in FIG. 13, the waveform of the driving signal of the reference driving circuit has wave distortion and especially rounding in the leading edges and distortion in the trailing edges, too.

On the other hand, as shown in FIG. 14 and FIG. 15, the waveform of the driving signal of each of the driving circuits of the first and second examples has greatly reduced wave distortion compared to the waves of the reference driving circuit shown in FIG. 13, and has sharp leading and trailing edges. Although the waves of the first example shown in FIG. 14 have overshoots in the leading edges, the waves of the second example shown in FIG. 15 show an ideal shape of the driving signal without any overshoot in the leading edges.

According to the result of the experiment described so far, the embodiment of the invention allows generation of a driving signal having an ideal waveform, and thereby achieves generation of pulsed light having an ideal waveform.

The remainder of the operations and effects of the second embodiment are similar to those of the first embodiment.

The present invention is not limited to the foregoing embodiments but may be practiced in still other ways. For example, the invention includes a case in which the high-potential power terminal and the low-potential power terminal are disposed side by side without the driving signal output terminal in between, and the driving signal output terminal is disposed adjacent to the high-potential power terminal or the low-potential power terminal.

According to the semiconductor laser driving circuit and the optical head of the invention described so far, the high-potential power terminal, the low-potential power terminal and the driving signal output terminal of the integrated circuit for driving the semiconductor laser are disposed in line at one of the sides of the integrated circuit. The capacitors are located beside the one of the sides of the integrated circuit. An end of each of the capacitors is connected to the high-potential power terminal while the other end is connected to the low-potential power terminal. Such a configuration allows the capacitors to be located near the switching element in the integrated circuit. As a result, according to the invention, it is possible to reduce the length of the wiring between the high-potential conductor and the low-potential conductor that relates to high-frequency signal components. It is thereby possible to minimize the delay and lead of the phase between the voltage and the current that result from the inductive and capacitive floating reactance the wiring has. As a result, the capacitors are capable of reducing the ripple components superposed on the supply voltage to such an extent that rounding would not be produced in the waves of a driving signal. The invention thus described achieves generation of a good driving signal even when the pulsed light emitted from the semiconductor laser has a small pulse width.

Obviously many modifications and variations of the present invention are possible in the light of the above teachings. It is therefore to be understood that within the scope of the appended claims the invention may be practiced otherwise than as specifically described.

What is claimed is:

1. A semiconductor laser driving circuit comprising: an integrated circuit for driving a semiconductor laser that emits light used for optical recording; and a substrate on which the integrated circuit is mounted, wherein:
   the integrated circuit incorporates: a switching element generating a driving signal for driving the semiconductor laser; a high-potential power terminal and a low-potential power terminal for feeding supply voltage to the switching element; and a driving signal output terminal for outputting the driving signal generated at the switching element to an external device;
   the high-potential power terminal, the low-potential power terminal and the driving signal output terminal are disposed side by side at one of sides of the integrated circuit;
   the substrate incorporates: a high-potential conductor that is connected to the high-potential power terminal and applies a high potential to the high-potential power terminal; a low-potential conductor that is connected to the low-potential power terminal and applies a low potential to the low-potential power terminal; and a driving signal transmitting conductor that connects the driving signal output terminal to the semiconductor laser and transmits the driving signal to the semiconductor laser; and
   the semiconductor laser driving circuit further comprises a capacitor that is disposed beside the one of the sides of the integrated circuit, one of ends of the capacitor being connected to the high-potential power terminal and the other end being connected to the low-potential power terminal.

2. The semiconductor laser driving circuit according to claim 1 wherein the driving signal output terminal is placed between the high-potential power terminal and the low-potential power terminal, and the capacitor is disposed to span the driving signal transmitting conductor.

3. The semiconductor laser driving circuit according to claim 1 wherein the one of the ends of the capacitor is connected to the high-potential conductor and connected to the high-potential power terminal via the high-potential conductor, and the other end of the capacitor is connected to the low-potential conductor and connected to the low-potential power terminal via the low-potential conductor.

4. The semiconductor laser driving circuit according to claim 1 wherein the capacitor is placed on the high-potential power terminal and the low-potential power terminal.

5. The semiconductor laser driving circuit according to claim 1 wherein the number of the capacitor is more than one and the capacitors are connected in parallel to each other.

6. An optical head comprising: a semiconductor laser that emits light used for optical recording; an optical system for applying the light emitted from the semiconductor laser to an optical storage medium; and a semiconductor laser driving circuit for driving the semiconductor laser, wherein:
   the semiconductor laser driving circuit comprises: an integrated circuit for driving the semiconductor laser; and a substrate on which the integrated circuit is mounted;
   the integrated circuit incorporates: a switching element generating a driving signal for driving the semiconductor laser; a high-potential power terminal and a low-potential power terminal for feeding supply voltage to the switching element; and a driving signal output terminal for outputting the driving signal generated at the switching element to an external device;
   the high-potential power terminal, the low-potential power terminal and the driving signal output terminal are disposed side by side at one of sides of the integrated circuit;
   the substrate incorporates: a high-potential conductor that is connected to the high-potential power terminal and applies a high potential to the high-potential power terminal; a low-potential conductor that is connected to the low-potential power terminal and applies a low potential to the low-potential power terminal; and a driving signal transmitting conductor that connects the driving signal output terminal to the semiconductor laser and transmits the driving signal to the semiconductor laser; and
   the semiconductor laser driving circuit further comprises a capacitor that is disposed beside the one of the sides of the integrated circuit, one of ends of the capacitor being connected to the high-potential power terminal and the other end being connected to the low-potential power terminal.

7. The optical head according to claim 6 wherein the driving signal output terminal is placed between the high-potential power terminal and the low-potential power terminal, and the capacitor is disposed to span the driving signal transmitting conductor.

8. The optical head according to claim 6 wherein the one of the ends of the capacitor is connected to the high-potential conductor and connected to the high-potential power terminal via the high-potential conductor, and the other end of the capacitor is connected to the low-potential conductor and connected to the low-potential power terminal via the low-potential conductor.

9. The optical head according to claim 6 wherein the capacitor is placed on the high-potential power terminal and the low-potential power terminal.

10. The optical head according to claim 6 wherein the number of the capacitor is more than one and the capacitors are connected in parallel to each other.

* * * * *